US006967555B2

(12) United States Patent
Yu et al.

(10) Patent No.: US 6,967,555 B2
(45) Date of Patent: Nov. 22, 2005

(54) MULTI-LEVEL SYMMETRICAL INDUCTOR

(75) Inventors: Jay Yu, Hsin-Tien (TW); Felix Kao, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 144 days.

(21) Appl. No.: 10/463,666

(22) Filed: Jun. 18, 2003

(65) Prior Publication Data

US 2004/0075521 A1    Apr. 22, 2004

(30) Foreign Application Priority Data

Oct. 17, 2002  (TW) .............................. 91123986 A

(51) Int. Cl.[7] .............................................. H01F 5/00
(52) U.S. Cl. ...................................................... 336/200
(58) Field of Search .......................... 336/65, 83, 200, 336/206–208, 232

(56) References Cited

U.S. PATENT DOCUMENTS

| | | | |
|---|---|---|---|
| 6,380,835 B1 | | 4/2002 | Lee |
| 6,707,367 B2 | * | 3/2004 | Castaneda et al. .......... 336/200 |
| 6,717,502 B2 | * | 4/2004 | Yue ............................. 336/200 |
| 6,759,937 B2 | * | 7/2004 | Kyriazidou ................. 336/200 |
| 6,794,977 B2 | * | 9/2004 | Christensen ................ 336/200 |
| 6,825,749 B1 | * | 11/2004 | Lin et al. .................... 336/200 |
| 6,867,677 B2 | * | 3/2005 | Nielson ....................... 336/200 |

OTHER PUBLICATIONS

A Fully Integrated CMOS DCS-1800 Frequency Synthesizer, IEEE. Journal of Solid-State Circuits. vol. 33. No. 12, Dec. 1998, pp. 2054-2055.
Miniature 3-D Inductors in Standard CMOS Process, IEEE Journal of Solid-state circuits, vol. 37, No. 4, Apr. 2002, pp. 471-472.

* cited by examiner

Primary Examiner—Tuyen T. Nguyen
(74) Attorney, Agent, or Firm—Winston Hsu

(57) ABSTRACT

An inductor includes a substrate, a first insulation layer, a second insulation layer, a first conductive section, a second conductive section, a third conductive section, and a fourth conductive section. The first conductive section and the second conductive section are symmetrical with respect to a first line. The third conductive section and the fourth conductive section are also symmetrical with respect to the first line. The first end of the first conductive section is connected to the first end of the fourth conductive section with a first via plug. The first end of the second conductive section is connected to the first end of the third conductive section with a second via plug.

6 Claims, 8 Drawing Sheets

MULTI-LEVEL SYMMETRICAL INDUCTOR

CROSS REFERENCE TO RELATED APPLICATIONS

BACKGROUND OF INVENTION

1. Field of the Invention

The present invention relates to an inductor, and more particularly, to a multi-level symmetrical inductor made with integrated circuit technology.

2. Description of the Prior Art

As semiconductor technology advances, to facilitate small low cost devices, wireless communication chips are frequently integrated with passive elements such as inductors, transformers, and capacitors. Inductors, for instance, are required by wireless integrated circuits for devices such as low noise amplifiers (LNA), mixers, voltage controlled oscillators (VCO), resistor matched networks, and filters.

Please refer to FIG. 1. FIG. 1 is a schematic diagram of a one-level spiral inductor 10 according to the prior art. A coil forms the planar inductor 10, which has two ends p1 and p2, and spirals around a point 0 from the outer end p1 to the inner end p2 forming a specific number of loops. Because the coil of the inductor 10 cannot directly overlap itself, the overlapping section of the coil in FIG. 1 is connected to another induction layer by a via plug connected to the end p2. A major drawback of the one-layer spiral inductor 10 according to the prior is that the inductor consumes a large chip area, increasing the cost and reducing the possibility of integrating it onto a chip. In addition, the quality factor of the inductor 10 and the resistance of the coil are inversely proportional, that is, the longer coil, the larger resistance. Thus, increased energy dissipation of the inductor 10 reduces the quality factor, and it become difficult to apply such an inductor in wireless integrated circuit design.

Please refer to FIG. 2. FIG. 2 is a schematic diagram of two-level spiral inductor 12 according to the prior art. For saving chip area, as shown in FIG. 2, the inductor 12 is designed as two layered coils. The inductor 12 has two ends p1 and p2 and spirally circles a point C starting at the outer end p1 from an outer ring to an inner ring for a desired number of loops, which is then connected to another layer by a via plug, and spirals from an inner ring to an outer ring finally connecting to the end p2. It deserves to be mentioned that current flowing in the two layered coils is in the same direction which increases the mutual inductance of the inductor 12, that is, the current flows into the end p1 from the outer ring to the inner ring in a clockwise direction then connects to the second layer by the via plug, and similarly flows clockwise from the inner ring to the outer ring to the end p2.

The two-layer inductor 12 reduces chip area and increases mutual inductance between the two layers. In the same area of chip, the inductance of the two-level inductor 12 is 2–4 times higher than that of the one-layer inductor 10. In other words, for the same inductance, the two layer inductor 12 needs only ½–¼ of chip area the one-layer inductor 10 requires. In addition, the two-layer inductor 12 needs fewer coils for the same inductance as the one-layer inductor 10. As fewer coils provide a lower resistance, the two-layer inductor 12 has a higher quality factor. Though the two-layer inductor 12 has a smaller area and a better quality factor, more and more wireless communication chip designs use differential circuits to reduce common mode noise, and inductors applied such a differential circuit should be symmetrical to prevent common mode noise. This symmetry means that the inductor has the same structure as seen from any end. In FIG. 2, the end p1 and the end p2 of the inductor 12 are not symmetrical, and if the inductor 12 is applied in a differential circuit, it will not suitably prevent common mode noise.

From the above mentioned, the one-layer spiral inductor 10 according to the prior art needs larger chip area, which means increasing cost. Additionally, as longer coils also have larger resistances, much energy is lost and the quality factor is poor. The two-level inductor 12 improves the area and the quality factor, however, is not symmetrical so that if the inductor 12 is applied in a differential circuit, it cannot prevent common mode noise.

SUMMARY OF INVENTION

It is therefore a primary object of the claimed invention to provide a multi-level symmetrical inductor made using integrated circuit technology to solve the above-mentioned problems.

According to the claimed invention, an inductor includes a substrate, a first insulation layer, a second insulation layer, a first conductive section, a second conductive section, a third conductive section, and a fourth conductive section. The first conductive section and the second conductive section are symmetrical with respect to a first line. The third conductive section and the fourth conductive section are also symmetrical with respect to the first line. The first end of the first conductive section is connected to the first end of the fourth conductive section through a first via plug. The first end of the second conductive section is connected to the first end of the third conductive section through a second via plug.

These and other object of the claimed invention will no doubt become obvious to those of ordinary skill in the art after reading the following detailed description of the preferred embodiment that is illustrated in the various figures and drawings.

DETAILED DESCRIPTION

Figure 1:
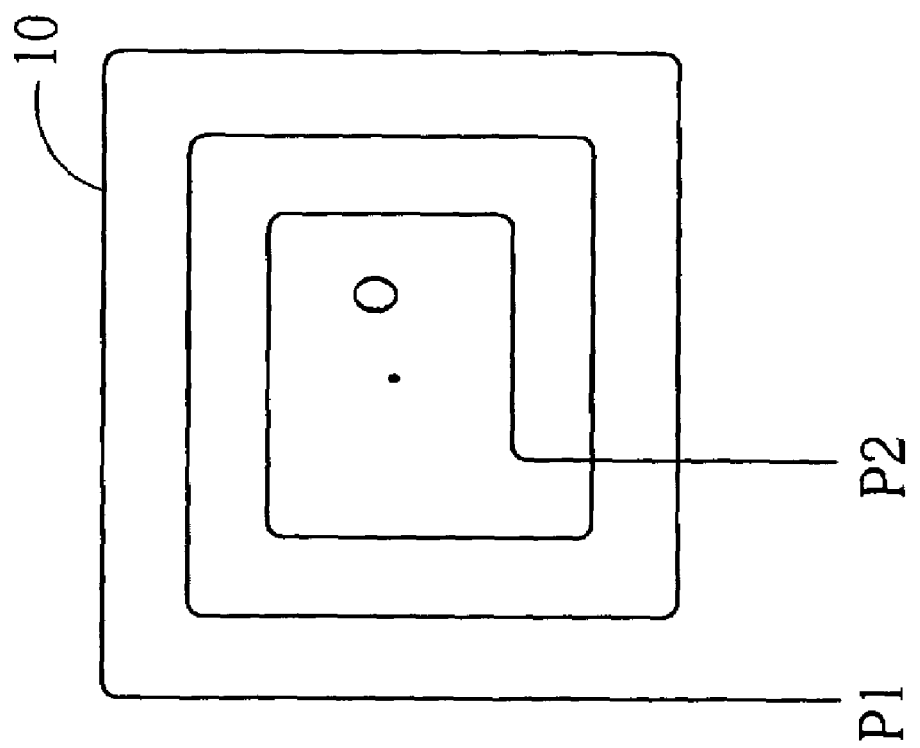
FIG. 1 is a schematic diagram of a one-level spiral inductor according to the prior art.
Figure 2:
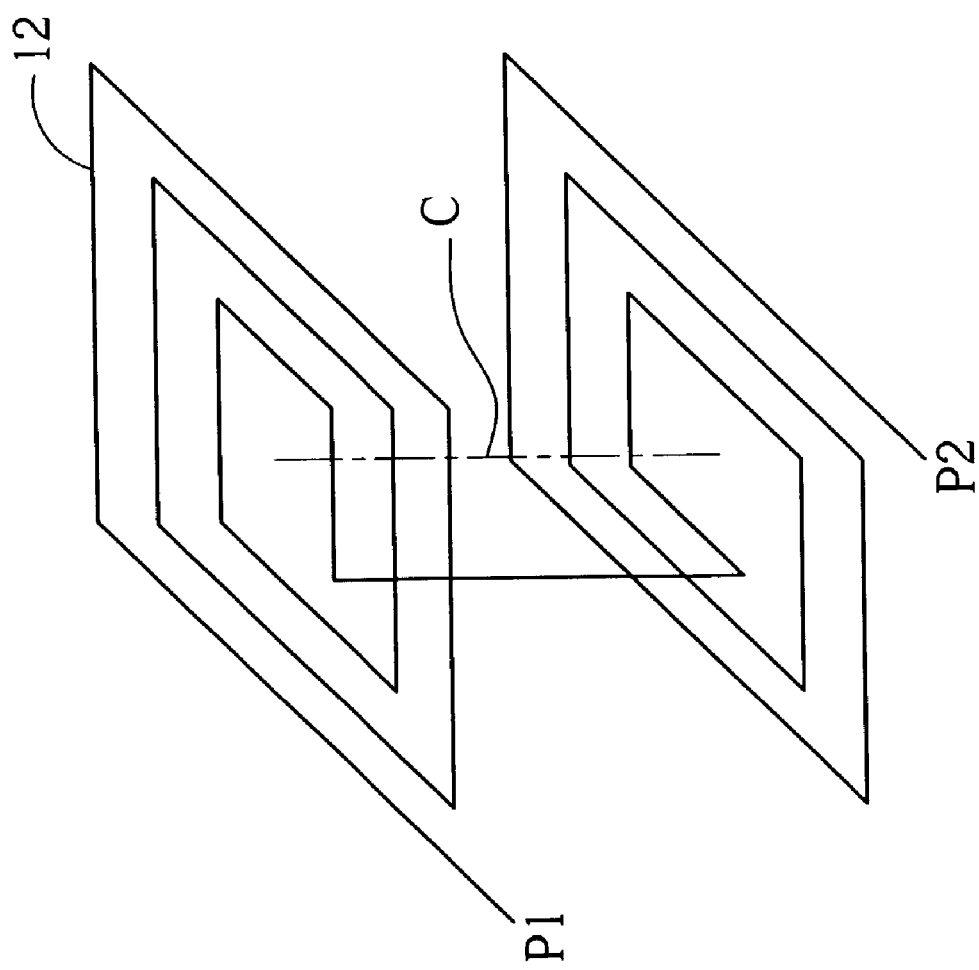
FIG. 2 is a schematic diagram of a two-level spiral inductor according to the prior art.
Figure 3:
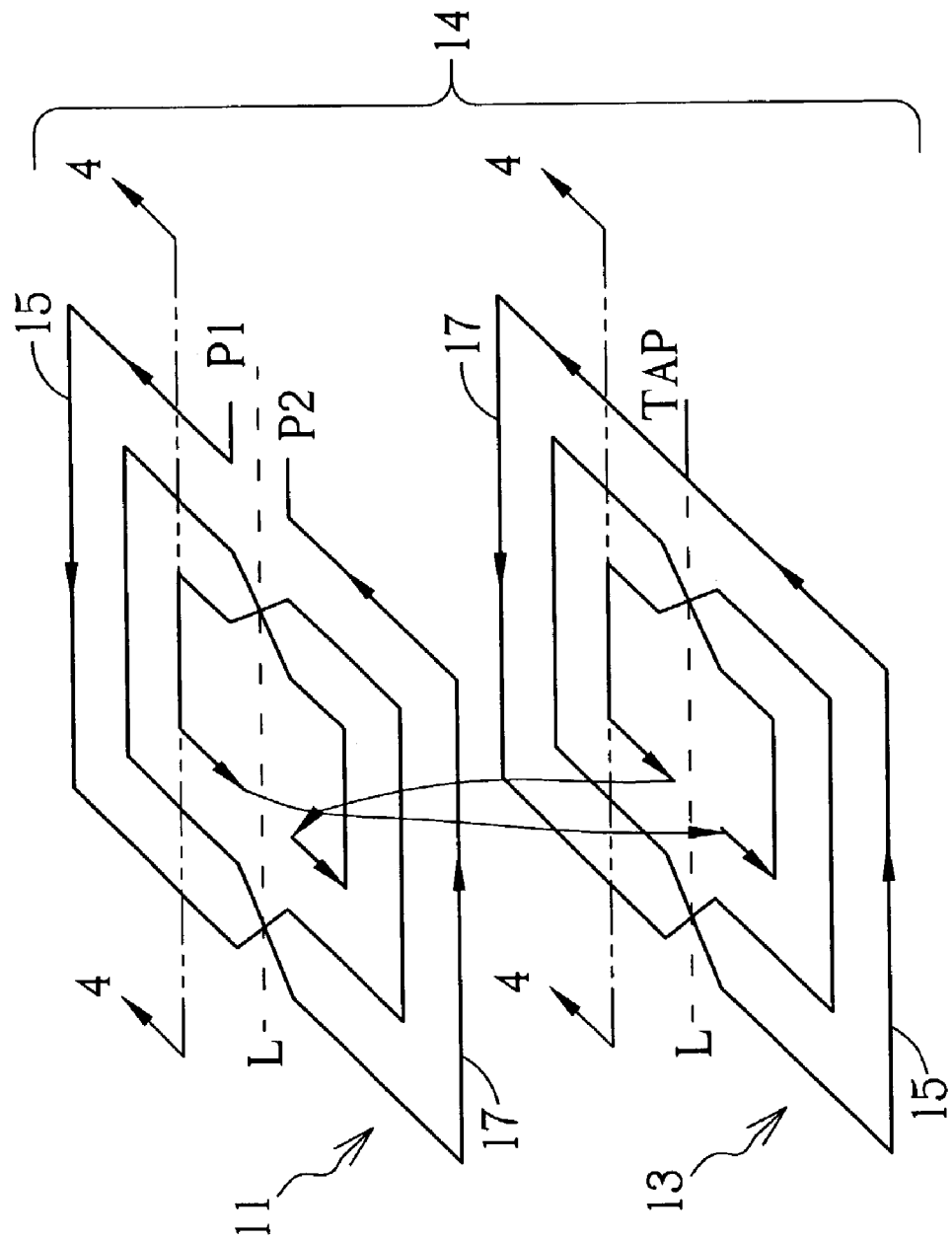
FIG. 3 is a schematic diagram of a two-level symmetrical inductor according to the present invention.

Please refer to FIG. 3. FIG. 3 is a schematic diagram of a two-level symmetrical inductor 14 according to the present invention. As shown in FIG. 3, the inductor 14 includes an upper coil 11 and a lower coil 13, each coil having three rings. The inductor 14 further includes two ends P1 and P2 that are symmetrical about dashed line L. From another viewpoint, the inductor 14 can be divided into a first winding 15 and a second winding 17. The first winding 15 is from the end P1 to the point TAP. The second winding 17 is from the point TAP to the end P2. Both the upper and lower coils 11, 13 are formed of two interlaced opposite-direction spiral coils 15, 17.

In the upper coil 11, current enters from the end P1 of the first winding 15 flowing in a counterclockwise direction through an outer ring, as indicated by arrows shown in FIG. 3. Each ring becomes a subsequent inner ring every 180 degrees, and the current follows this spiraling path. After flowing into the innermost ring of the first winding 15 of the upper coil 11, the current enters the innermost ring of the first winding 15 of the lower coil 13, which becomes a subsequent outer ring after 180 degrees. The current flows to the point TAP separating the first winding 15 and the second winding 17 and enters to the outermost ring of the second winding 17 of the lower coil 13. The current flows in a counterclockwise direction to a subsequent inner ring every 180 degrees. After flowing into the innermost ring of the second winding 17 of the lower coil 13, the current enters the innermost ring of the second winding 17 of the upper coil 11. The current flows from inner to outer rings in a counterclockwise direction in the second winding 17 of the upper coil 11, changing to a subsequent outer ring every 180 degrees. The current finally flows to the outermost ring of the second winding 17 of the upper coil 11 and arrives the end P2.

Figure 4:
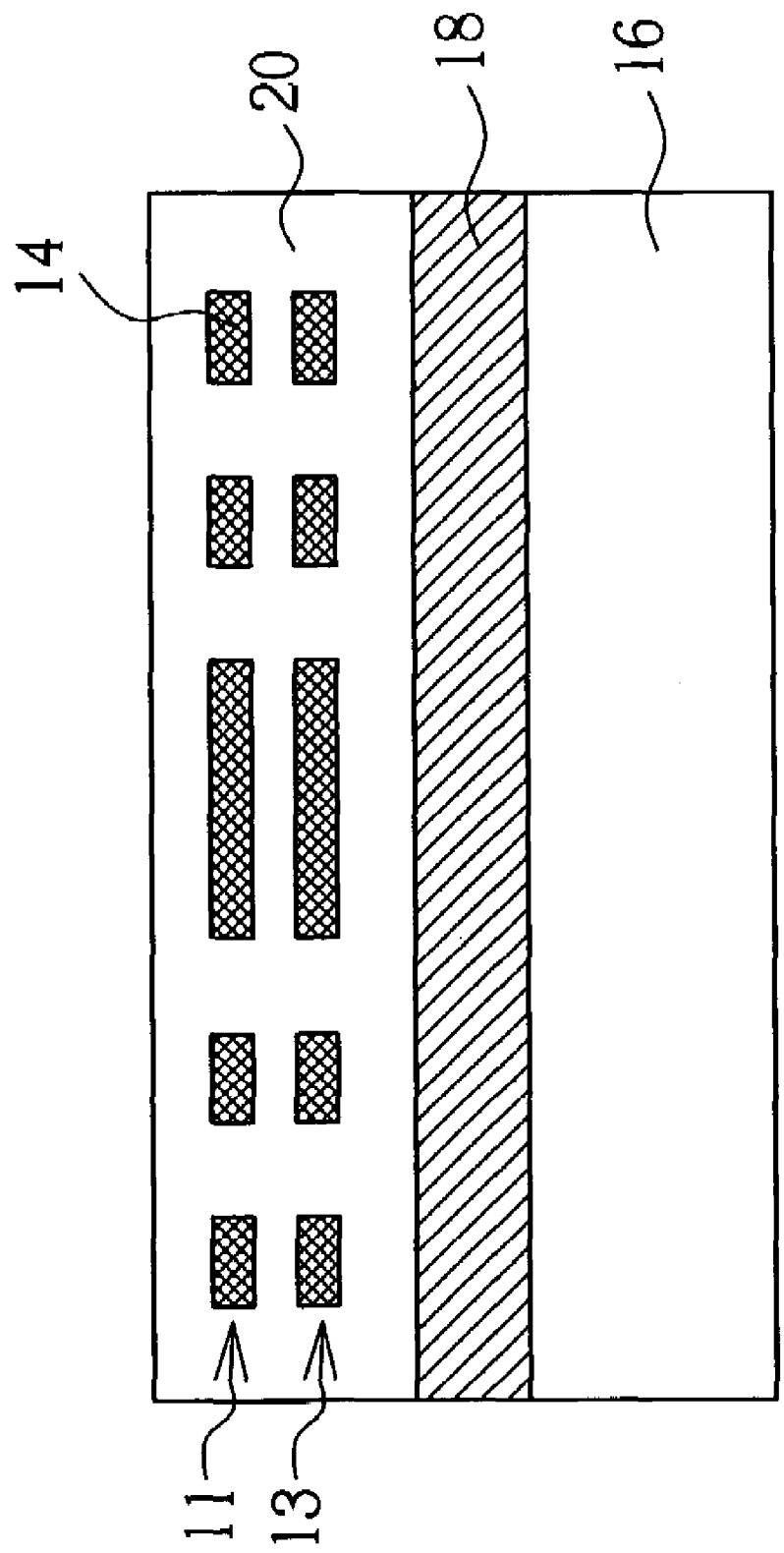
FIG. 4 is a cross-sectional view along lines 4—4 in FIG. 3.

Please refer to FIG. 4. FIG. 4 is a cross-sectional view along lines 4—4 in FIG. 3. As shown in FIG. 4, the two-level symmetrical inductor 14 according to the present invention is formed by a conducting wire on a semiconductor substrate 16. An insulation layer 18 is provided between the inductor 14 and the substrate 16. The upper coil 11 and the lower coil 13 are formed in another insulation layer 20. Because the inductor 14 according to the present invention includes the upper coil 11 and the lower coil 13, as shown in FIG. 3, when current flows in the upper coil 11 from the inner ring to the outer ring intercrossing the conductive wire, the current flows to the lower coil 13 through a via plug. Similarly, when current flows in the lower coil 13 from the outer ring to the inner ring intercrossing the conductive wire, the current flows to the upper coil 11 through another via plug. The detailed layout is illustrated as follows.

Figure 5:
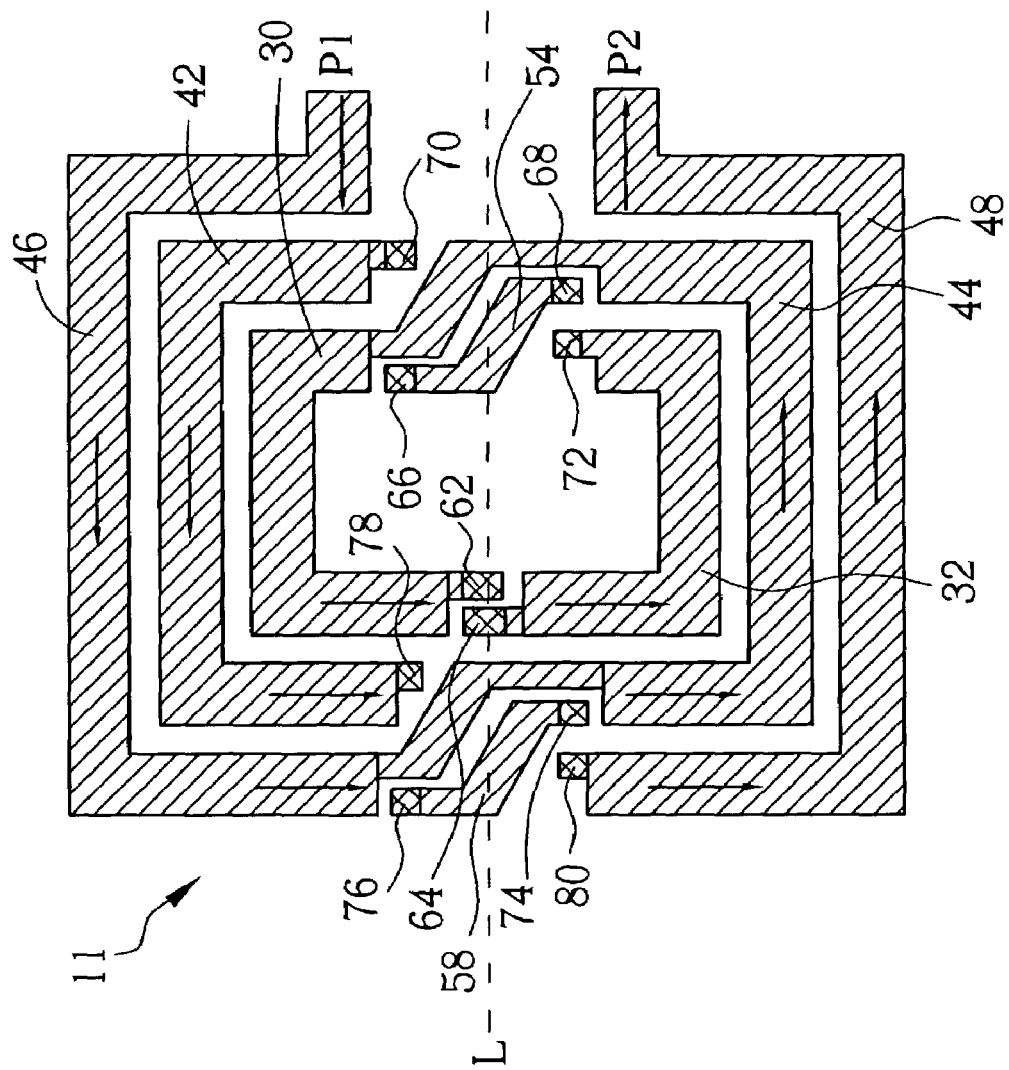
FIG. 5 is a top view of the upper coil of the inductor in FIG. 3.
Figure 6:
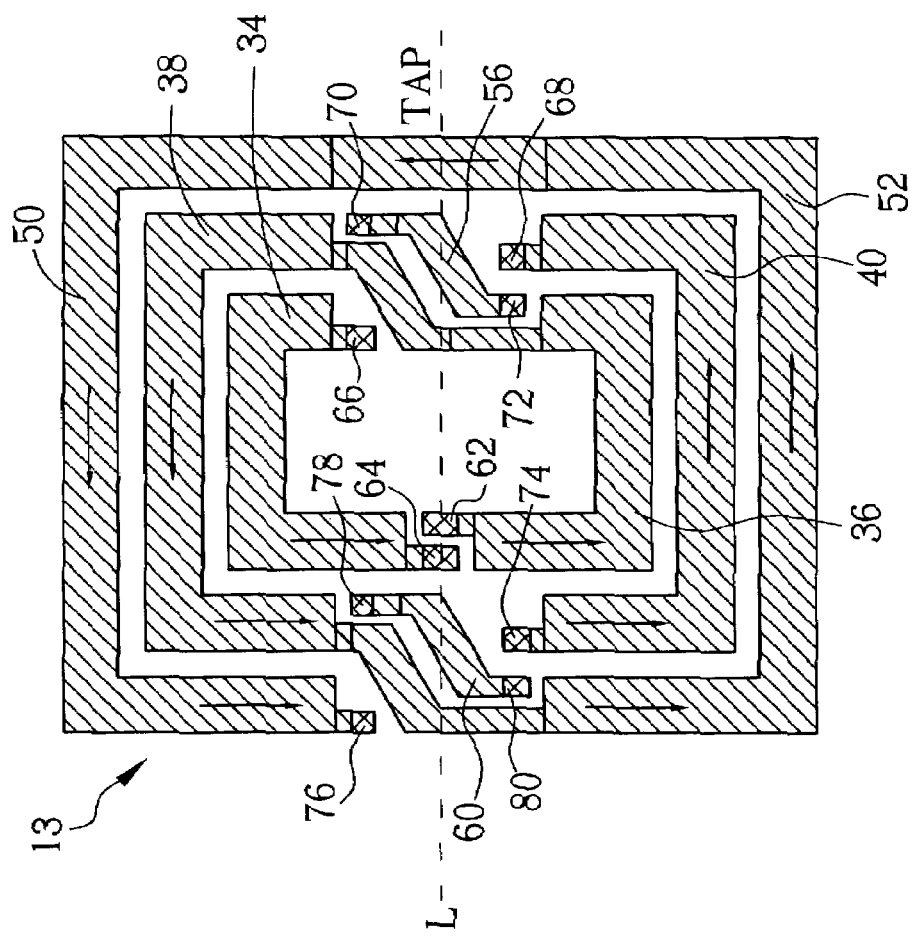
FIG. 6 is a top view of the lower coil of the inductor in FIG. 3.

Please refer to FIG. 5 and FIG. 6. FIG. 5 is a top view of the upper coil of the inductor in FIG. 3. FIG. 6 is a top view of the lower coil of the inductor in FIG. 3. As shown in FIG. 5, the upper coil 11 of the inductor 14 includes a first conductive section 30 on a first side of the dashed line L, a second conductive section 32 on a second side of the dashed line L, a seventh conductive section 42 on the first side of the dashed line L, an eighth conductive section 44 on the second side of the dashed line L, a ninth conductive section 46 on the first side of the dashed line L, a tenth conductive section 48 on the second side of the dashed line L, a first connecting conductive section 54, and a third connecting conductive section 58. The first conductive section 30 and the second conductive section 32 are symmetrical about the dashed line L. The seventh conductive section 42 and the eighth conductive section 44 are symmetrical about the dashed line L. The ninth conductive section 46 and the tenth conductive section 48 are symmetrical about the dashed line L. As shown in FIG. 6, the lower coil 13 of the inductor 14 includes a third conductive section 34 on a first side of the dashed line L, a fourth conductive section 36 on a second side of the dashed line L, a fifth conductive section 38 on the first side of the dashed line L, a sixth conductive section 40 on the second side of the dashed line L, an eleventh conductive section 50 on the first side of the dashed line L, a twelfth conductive section 52 on the second side of the dashed line L, a second connecting conductive section 56, and a fourth connecting conductive section 60. The third conductive section 34 and the fourth conductive section 36 are symmetrical about the dashed line L. The fifth conductive section 38 and the sixth conductive section 40 are symmetrical about the dashed line L. The eleventh conductive section 50 and the twelfth conductive section 52 are symmetrical about the dashed line L.

The two-level symmetrical inductor 14 according to the present invention is structured as follows. A first end of the first conductive section 30 is connected to a first end of the fourth conductive section 36 through a first via plug 62. A second end of the first conductive section 30 is connected to a first end of the eighth conductive section 44. A first end of the second conductive section 32 is connected to a first end of the third conductive section 34 through a second via plug 64. A second end of the second conductive section 32 is connected to a second end of the second connecting conductive section 56 through a sixth via plug 72. A first end of the second connecting conductive section 56 is connected to a first end of the seventh conductive section 42 through a fifth via plug 70. A second end of the third conductive section 34 is connected to a first end of the first connecting conductive section 54 through a third via plug 66. A second end of the first connecting conductive section 54 is connected to a first end of the sixth conductive section 40 through a fourth via plug 68. A second end of the fourth conductive section 36 is connected to a first end of the fifth conductive section 38. A second end of the fifth conductive section 38 is connected to a first end of the twelfth conductive section 52. A second end of the sixth conductive section 40 is connected to a first end of the third connecting conductive section 58 through a seventh via plug 74. A second end of the third connecting conductive section 58 is connected to a second end of the eleventh conductive section 50 through a eighth via plug 76. A second end of the seventh conductive section 42 is connected to a first end of the fourth connecting conductive section 60 through a ninth via plug 78. A second end of the fourth connecting conductive section 60 is connected to a second end of the tenth conductive section 48 through a tenth via plug 80. A second end of the eighth conductive section 44 is connected to a second end of the ninth conductive section 46. A first end of the eleventh conductive section 50 is connected to a second end of the twelfth conductive section 52, that is, the point TAP in FIG. 3. A first end of the ninth conductive section 46 is the point P1 of the inductor 14 and a first end of the tenth conductive section 48 is the point P2.

Figure 7:
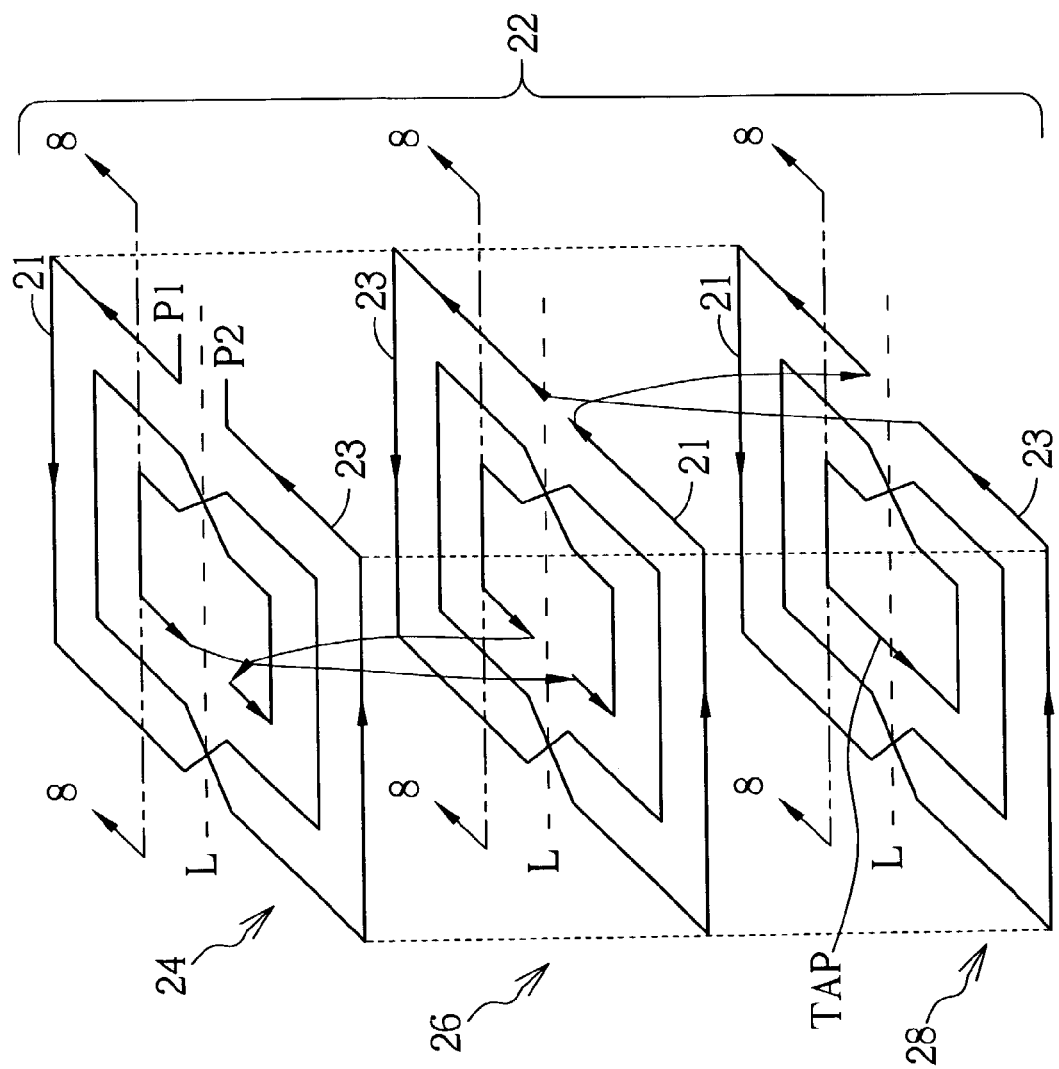
FIG. 7 is a schematic diagram of a three-level symmetrical inductor according to the present invention.
Figure 8:
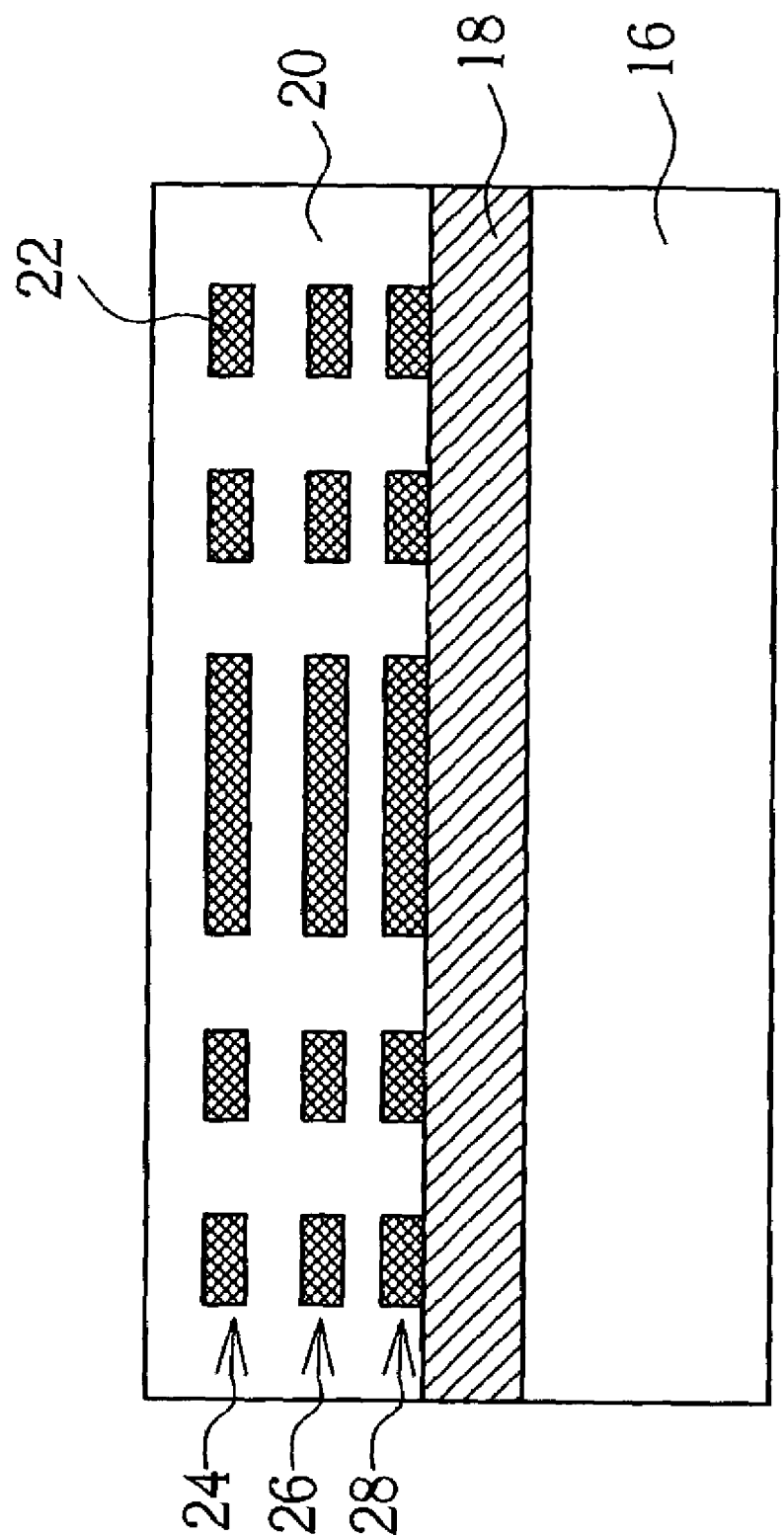
FIG. 8 is a cross-sectional view along lines 8—8 in FIG. 7.

Please refer to FIG. 7 and FIG. 8. FIG. 7 is a schematic diagram of a three-level symmetrical inductor 22 according to the present invention. FIG. 8 is a cross-sectional view along lines 8—8 in FIG. 7. As shown in FIG. 7, the inductor 22 includes an upper coil 24, a middle coil 26, and a lower coil 28, each coil having three rings. The inductor 22 further includes two ends P1 and P2, the end P1 and the end P2 being symmetrical about a dashed line L. The inductor 22 can be divided into a first winding 21 and a second winding 23. The first winding 21 is from the end P1 to the point TAP. The second winding 23 is from the point TAP to the end P2. In the upper coil 24, current flows into the end P1, and along arrows shown in FIG. 7, through the upper coil 24, the middle coil 26, and the lower coil 28 of the first winding 21, then out of the end P2 through the lower coil 28, the middle coil 26, and the upper coil 24 of the second winding 23. As shown in FIG. 8, the three-level symmetrical inductor 22 according to the present invention is formed by a conductive wire on the semiconductor substrate 16. The insulation layer 18 is included between the inductor 22 and the substrate 16. The upper coil 24, the middle coil 26, and the lower coil 28 are formed in the other insulation layer 20.

In FIG. 3 and FIG. 7, the inductor according to the present invention is exemplarily shown with two and three layers respectively. According to the structures of these examples an inductor according to the present invention is capable of having many layers. In the same area, the inductance of an inductor according to the present invention having M layers is M to $M^2$ times the inductance of an inductor having a single layer. Although the inductors shown in FIG. 3 and FIG. 7 are rectangular, present invention inductors can be designed as hexagons, octagons, circles, or any other shape, the smoother the shape the better the quality factor of the inductor.

From the above-mentioned, the multi-level symmetrical inductor according to the present invention increases the mutual inductance and the inductance per unit area by using many conductive wires. The multi-level inductor according to the present invention needs less conductive wire than the inductor according to the prior art to have the same inductance, and thus the resistance of the present invention inductor is reduced and the quality factor is increased. Moreover, each layer of the inductor according to the present invention is designed as symmetrical, that is, the two ends of the inductor see the same structure, which allows the inductor to be used in a differential circuit to reduce common mode noise.

In contrast to the prior art, the inductor according to the present invention needs less chip area than the inductor according the prior art reducing costs. In addition, the inductor according to the present invention uses many layers to increase mutual inductance. In the same area, the inductance according to the present invention is larger than the inductance according to the prior art, that is, the multi-level inductor needs shorter length of conductive wire to have the same inductance resulting in the quality factor being higher. Finally, an inductor applied in a differential circuit has to be symmetrical to reduce common mode noise. However, the inductor according to the prior is not symmetrical and is not suitable to be applied in the differential circuit. The inductor according to the present invention has two symmetrical ends and is thereby capable of being applied in a differential circuit to reduce common mode noise.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An inductor made by integrated circuit technology comprising:
   a substrate;
   a first insulation layer formed on the substrate;
   a second insulation layer formed adjacent to the first insulation layer;
   a first conductive section formed in a first layer located on a first side of a first line;
   a second conductive section formed in the first layer located on a second side of the first line, the first conductive section and the second conductive section being symmetrical with respect to the first line;
   a third conductive section formed in a second layer located on the first side of the first line;
   a fourth conductive section formed in the second layer located on the second side of the first line, the third conductive section and the fourth conductive section being symmetrical with respect to the first line;
   wherein a first end of the first conductive section is connected to a first end of the fourth conductive section with a first via plug, and a first end of the second conductive section is connected to a first end of the third conductive section with a second via plug.

2. The inductor of claim 1 further comprising:
   a fifth conductive section formed in the second layer located on the first side of the first line;
   a sixth conductive section formed in the second layer located on the second side of the first line, the fifth conductive section and the sixth conductive section being symmetrical with respect to the first line; and
   a first connecting conductive section formed in the first layer, a first end of the first connecting conductive section connected to a second end of the third conductive section with a third via plug, a second end of the first connecting conductive section connected to a first end of the sixth conductive section with a fourth via plug;
   wherein a first end of the fifth conductive section is connected directly to a second end of the fourth conductive section in the second layer.

3. The inductor of claim 1 further comprising:
   a seventh conductive section formed in the first layer located on the first side of the first line;
   a eighth conductive section formed in the first layer located on the second side of the first line, the seventh conductive section and the eighth conductive section being symmetrical with respect to the first line; and
   a second connecting conductive section formed in the second layer, a first end of the second connecting conductive section connected to a first end of the seventh conductive section with a fifth via plug, a second end of the second connecting conductive section connected to a second end of the second conductive section with a sixth via plug;
   wherein a first end of the eighth conductive section is connected directly to a second end of the first conductive section in the first layer.

4. An integrated circuit inductor comprising:
   at least two stacked planar inductor layers ranging from a top layer to a bottom layer, the top layer being odd and the remaining layers consecutively alternating between even and odd, each layer comprising:
      a right spiral inductor having an outer end and an inner end; and
      a left spiral inductor having an outer end and an inner end, the left spiral inductor substantially mirror symmetric to the right spiral inductor in the layer and offset from the right spiral inductor in the layer;
      wherein both the right and left spiral inductors are disposed in the layer except for regions where the first right and left spiral inductors overlap, in which a part of one of the right or left spiral inductors is disposed in an adjacent layer;
   wherein the outer ends in the top layer are separate input or output ends of the integrated circuit inductor;
   wherein the bottom layer, when even, has outer ends of the left and right spiral indictors mutually connected, and when odd, has inner ends of the left and right spiral indictors mutually connected; and
   wherein for each layer except the bottom layer, when odd, the inner end of the right spiral inductor is connected to the inner end of the left spiral inductor of the next lower layer and the inner end of the left spiral inductor is connected to the inner end of the right spiral inductor of the next lower layer, and when even, the outer end of the right spiral inductor is connected to the outer end of the left spiral inductor of the next lower layer and the Outer end of the left spiral inductor is connected to the outer end of the right spiral inductor of the next lower layer.

5. The integrated circuit inductor of claim 4, wherein for regions where the first right and left spiral inductors overlap, the adjacent layer to an odd layer is the next lower layer, and the adjacent layer to an even layer is the next upper layer.

6. The integrated circuit inductor of claim 5, wherein in a layer, the offset for the left spiral inductor from the right spiral inductor is in a direction substantially perpendicular to a line between the outer and inner ends of the right spiral inductor.

* * * * *